(12) United States Patent
Krüger et al.

(10) Patent No.: US 7,689,262 B2
(45) Date of Patent: Mar. 30, 2010

(54) METHOD AND MAGNETIC RESONANCE TOMOGRAPHY APPARATUS FOR CORRECTING CHANGES IN THE BASIC MAGNETIC FIELD

(75) Inventors: Gunnar Krüger, Erlangen (DE); Stefan Thesen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 983 days.

(21) Appl. No.: 10/887,413

(22) Filed: Jul. 8, 2004

(65) Prior Publication Data

US 2005/0033156 A1  Feb. 10, 2005

(30) Foreign Application Priority Data

Jul. 8, 2003  (DE) ............... 103 30 926

(51) Int. Cl.
*A61B 5/05* (2006.01)
(52) U.S. Cl. ............ 600/410; 324/309; 324/307
(58) Field of Classification Search ......... 600/407, 600/408, 410–423; 324/306–312, 318–322, 324/300

See application file for complete search history.

(56) References Cited

U.S. PATENT DOCUMENTS

| | | | |
|---|---|---|---|
| 5,614,827 A | 3/1997 | Heid | |
| 5,652,514 A | 7/1997 | Zhang et al. | |
| 5,770,943 A | 6/1998 | Zhou | |
| 6,118,273 A | 9/2000 | Takizawa et al. | |
| 6,275,038 B1 | 8/2001 | Harvey | |
| 7,196,518 B2 * | 3/2007 | Yatsui et al. | 324/307 |
| 2002/0173713 A1 * | 11/2002 | Pfefferbaum et al. | 600/407 |

OTHER PUBLICATIONS

"Spatial Registration and Normalization of Images," Friston et al., Human Brain Mapping, vol. 2, (1995) pp. 165-189.
"Artifact Due to $B_0$ Fluctuation in fMRI: Correction Using the k-Space Central Line," Durand et al. Mag. Res. in Med., vol. 46 (2001) pp. 198-201.

* cited by examiner

*Primary Examiner*—Brian Casler
*Assistant Examiner*—Elmer Chao
(74) *Attorney, Agent, or Firm*—Schiff Hardin LLP

(57) ABSTRACT

In the examination of a subject with a magnetic resonance tomography apparatus, data for a slice of the subject to be examined are obtained with a sequence of a fast MRT imaging method that includes at least three phase correction scans and measurement signals of the respective phase correction scans as well as of the slice are obtained. The phase difference of corresponding data points of two phase correction scans are calculated point-by-point, the average phase difference between the phase correction scans is evaluated, and the frequency offset between the actual resonance frequency relative to the adjusted resonance frequency is calculated based on the average phase difference and the echo time difference between the phase correction scans used. A B0 field map is calculated dependent on the frequency offset and, the measurement data for the slice are corrected using the calculated B0 field map.

19 Claims, 5 Drawing Sheets

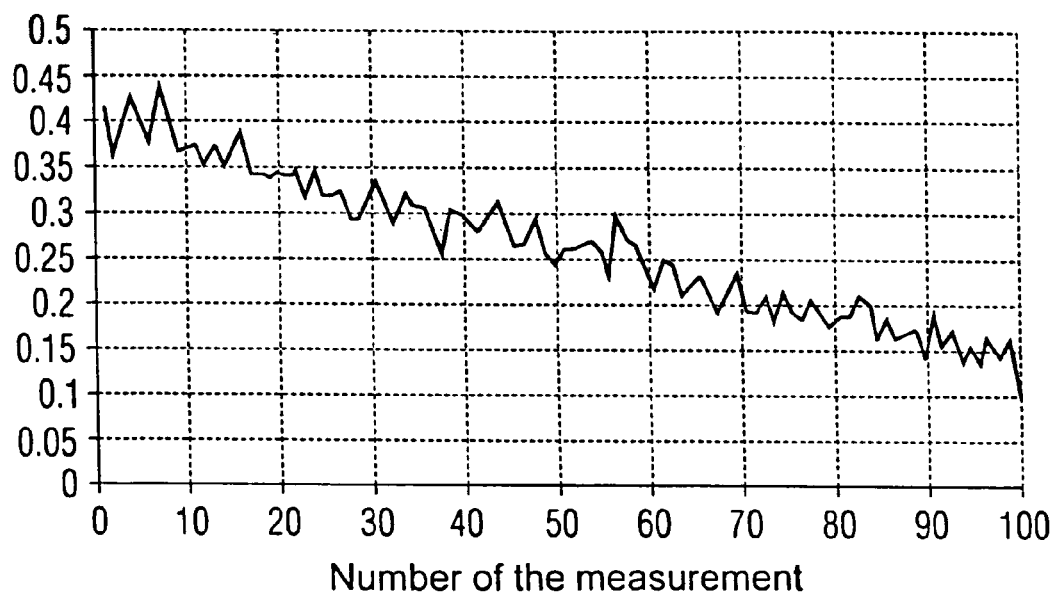

METHOD AND MAGNETIC RESONANCE TOMOGRAPHY APPARATUS FOR CORRECTING CHANGES IN THE BASIC MAGNETIC FIELD

BACKGROUND OF THE INVENTION

1. Field of the Invention

The present invention generally concerns magnetic resonance tomography (MRT) as employed in medicine for the examination of patients. The present invention is in particular concerned with a method for determination of the B0 (basic magnetic) field, in particular given the use of fast MRT imaging methods such as, for example, TSE, EPI, SSEPI. A projection obtained of the B0 field (B0 field map) of the acquired slice enables the correction of image artifacts arising due to changes in the B0 field.

2. Description of the Prior Art

MRT is based on the physical phenomenon of nuclear magnetic resonance and has been successfully used as an imaging method in medicine and biophysics for over 15 years. In this examination method, the subject is exposed to a strong, constant magnetic field. The nuclear spins of the atoms of the subject, which were previously oriented randomly, thereby align. Radio-frequency energy can now excite these "ordered" nuclear spins to a specific oscillation (resonant frequency). This oscillation generates the actual measurement signal (RF response signal) in MRT, which is acquired by suitable receiver coils. Using non-homogeneous magnetic fields generated by gradient coils, the measurement subject can be spatially coded in all three spatial directions, which is generally designated as a "spatial coding".

The acquisition of the data in MRT ensues in what is known as k-space (frequency domain). The MRT image in the image domain is linked with the MRT data in k-space by means of Fourier transformation. The spatial coding of the subject, which spans the k-space, ensues by means of orthogonal gradients in all three spatial directions. Differentiation is made between the slice selection (establishes an acquisition slice in the subject, typically the z-axis), the frequency coding (establishes a direction in the slice, typically the x-axis) and the phase coding (determines the second dimension within the slice, typically the y-axis).

A slice is thus initially selectively excited, for example in the z-direction. The coding of the spatial information in the slice ensues by a combined phase and frequency coding by means of these two already-mentioned orthogonal gradient fields which, in the example of a slice excited in the z-direction, are generated by the afore-mentioned gradient coils in the x-direction and y-direction.

A possible format to acquire the data in an MRT experiment is the method of echo-planar imaging (EPI). The basis of this method is to generate, after an individual (selective) RF excitation in a very short time span, a series of echoes in the readout gradient (Gx) that are associated by a suitable gradient switching (modulation of the phase coding gradient Gy) with various lines in the k-matrix. All lines of the k-matrix can be acquired in this manner with a single sequence pass (single-shot SS).

Such a single-shot method (SSEPI)—due to the speed of the acquisition of a slice—presently represents the dominant clinically applied method in MRT imaging with which functional MRT imaging (fMRT), perfusion imaging and diffusion imaging can be realized.

Variants of the echo planar technique differ only in how the phase coding gradients are switched, meaning how the data points of the k-matrix are sampled (scanned).

An EPI pulse sequence with a sinusoidally oscillating readout gradient and a constant phase coding gradient is shown in FIG. 5A. A constant phase coding gradient with sinusoidally oscillating readout gradient leads to a likewise sinusoidal sampling of the k-space, as is illustrated in FIG. 5b. The readout of the echo series must be concluded within a time span that corresponds (in terms of magnitude) to the decay of the transverse magnetization. Otherwise, the various lines of the k-matrix would be too significantly differently weighted, depending on their sequence of detection. In addition to this, interferences of local field inhomogeneities increase with increasing readout time. Due to the necessity of such high measurement speeds, the echo planar technique places very high requirements on the gradient system (in practice, for example, gradient amplitudes of approximately 25 mT/m are used; in particular to change polarities of the gradient field, significant energies must be converted in the shortest possible time; the switching times are, for example, in the range of $\leq 0.3$ ms). Due to the large (in comparison with many other MR imaging techniques) length of the readout train, typically of 20-150 ms, the EPI method is sensitive to B0 field interferences. Temporally constant static effects influence the quality of the image data. The B0 field can, with good approximation, be assumed as constant over the length of the readout train for the following observations. In the application of the EPI technique, however, data typically are acquired over a longer time span of multiple minutes up to an hour and more. Over these time spans, fluctuations of the B0 field can occur due to external interferences (for example, elevators, street traffic, etc. in the proximity of the base field magnet of an MRT apparatus) as well as due to apparatus instabilities (a B0 field drift of the scanner is always known in principle). For example, given the long time series of data sets that are measured with EPI, fluctuations of the absolute value of the otherwise homogenous B0 field cause visible subject displacements in the phase coding direction (typical values: given a 128×128 pixel matrix, corresponding to approximately 10 Hz, one voxel—1.5 mm—displacement). In the case of functional imaging, such apparent subject movements are reliably removed from the measurement data as movement correction technique (Friston et al, Hum. Brain Map. 2: 165-189, 1995). Given the combination of EPI with contrast agent-supported methods (perfusion imaging), however, these effects can be corrected only with difficulty because the successive images are very different due to the contrast agent bolus flowing therethrough. This can lead to errors or given a low residual signal in the images, to outright impossibility of the image analysis. A similar problem occurs in diffusion imaging. The individual images are typically significantly different due to the strength of the diffusion coding as well as the coding direction. Furthermore, in particular given stronger diffusion coding, the information must be measured multiple times in order to actually obtain an acceptable ratio of signal to noise. The data of a single acquisition are unusable for a correction due to the high noise portion. If, for example, the B0 field now changes during the diffusion measurement, the individual acquisitions are displaced relative to one another, and the resulting image quality can be impaired.

Moreover, not only are temporal changes of the B0 field problematic, but also the variation of the absolute value of B0 across the sample or the patient to be examined. Normally, only B0 field deviations of the first and second order can be compensated by active and/or passive shimming. B0 field deviations of a higher order cause a residual curve of the B0 field of some 10 to 100 Hz in the homogeneity volume that cannot be corrected. Signals within the selected slice are possibly acquired off-resonance. In the case of echo planar imaging, this in turn leads to an apparent displacement of the measurement subject, meaning the planned or calculated image position (slice position) is typically incorrect by a few millimeters (up to centimeters). Problems with the interpretation and further use of the obtained images—for example given overlay with other measurement results for further planning of the examination and/or therapy—can result from this.

Conventionally in the case of echo planar imaging, artifacts due to temporal changes of the B0 field can be compensated under certain conditions. A prevalent method for this is known as "image matching": a displacement or a drift of the subject in successive images is back-projected, by the rotation and/or translation being determined in which, for example, the difference of both images is minimal at the pixel level. In the case of imaging methods with significant contrast changes (such as, for example, diffusion imaging, perfusion imaging), however, this method frequently cannot be successfully used (given contrast changes, a comparison of the acquired data is increasingly more difficult). In addition, the image data of all individual acquisitions must exhibit a sufficiently high signal-to-noise ratio.

A further method for compensation of the effects occurring due to temporal changes of the B0 field is described in Durand (Durand et al., Journal of Magnetic Resonance in Medicine 46: 198-201, 2001): at each measurement (scan of the k-matrix), the phase of the middle (central) k-space line is averaged over the line, and this value is compared with the averaged phase of the preceding measurement (same slice) of the same line. Given B0 field fluctuations, averaged successive phases will be different. By comparison of the phases the B0 field, changes can be detected and the image can be correspondingly corrected and back-projected.

The method for correction proposed by Durand et al has also proven in practice to be only of limited capability. As already explained, with contrast agent-aided methods (perfusion imaging), the phase information is significantly altered by the (paramagnetic) contrast agent, such that a comparison of the averaged phases across a plurality of acquisitions collapses. Due to movements (for example, brain pulsation), diffusion imaging a priori leads to unknown displacements of the k-space data, such that a comparison of identical k-space lines is problematic. Moreover, in the diffusion coding, additional phase differences between the individual acquisitions of the comparison proposed by Durand et al of central k-space can be hampered or even can be completely impossible to devise. Finally, the received signal of individual acquisitions is increasingly severely noisy, in particular at higher diffusion coding strengths, such that no sufficiently precise phase information is available.

SUMMARY OF THE INVENTION

An object of the present invention is to provide a method with which, in a simple manner and for every MRT apparatus, in particular for functional, contrast agent-aided and diffusion measurement methods, during the measurement the B0 field can be quantified for each slice absolutely or relative to the beginning of the measurement, and on this basis a correction can be effected only in the image plane or in k-space.

This object is achieved according to the invention by a method for calculation of a one-dimensional map of the basic magnetic field B0 and subsequent correction, based on this map, of image artifacts due to B0 field changes, in the examination of a subject with a magnetic resonance tomography apparatus, including the steps of measuring data of a slice of the subject to be examined with a sequence of a fast MRT imaging method that includes at least three phase correction scans and acquiring measurement signals for the respective phase correction scans as well as of the slice, calculating the phase difference of the data points point-by-point (respectively pertaining to one another) for two phase correction scans in the form of the acquired measurement signals of the respective phase correction scans, evaluating of the average phase difference between the phase correction scans, calculating the frequency offset between the actual resonant frequency relative to the adjusted resonant frequency based on the average phase difference and the echo time difference between the phase correction scans used, calculating a B0 field map dependent on this frequency offset, correcting the measurement data for the slice using the calculated B0 field map.

Preferably, only such phase corrections scans that have been acquired in the same readout direction are used for the point-by-point calculation of the phase difference.

The evaluation of the average phase difference ensues in a first embodiment of the invention on the basis of an average value formation, or in a second embodiment by adaptation of a suitable function to the measurement values.

In the case of an adaptation using a suitable function, it is (if possible) advantageous to correct the shimming of the basic field in the readout direction for the currently acquired slice on the basis of this function, as well as to implement a correction of the measurement data.

The above object also is achieved in accordance with the invention by a method for calculation of a one-dimensional map of the base magnetic field B0 and subsequent correction, based on this map, of image artifacts due to B0 field changes, in the examination of a subject by means of a magnetic resonance tomography apparatus, including the steps of measuring data of a slice of the subject to be examined with a sequence of a fast MRT imaging method that includes one phase correction scan and acquiring measurement signals of the phase correction scan as well as of the slice, calculating an average value of the data points point-by-point (respectively pertaining to one another) for the phase correction scan as well as of the middle k-space line of the slice in the form of the acquired measurement signals, calculating the average phase difference between the phase correction scan and the middle k-space line on the basis of the average value, calculating the frequency offset between the actual resonant frequency relative to the adjusted resonant frequency based on the average phase difference and the time difference between the phase correction scan and the passage of the middle k-space line, calculating a B0 field map dependent on this frequency offset, correcting of the measurement data for the slice using the calculated B0 field map.

In both of the inventive methods, the calculation of the B0 field map can ensue either by calculation of the absolute value of the B0 field relative to the gyromagnetic ratio or by calculation of the change of the B0 field relative to the beginning of the measurement.

The phase correction scans preferably are measured in a single sequence pass, independent of the slice measurement, preferably with a small flip angle of the excitation pulse.

The MRT images corrected on the basis of the B0 field map, in accordance with the invention, correctly overlaid with anatomical high-resolution images.

The inventive method enables one to differentiate an apparent translation in the image from a real translation to correspondingly make corrections.

In the case of spectroscopic measurements, the phase correction scans can be arbitrarily interleaved with the actual spectroscopic measurements.

In order to achieve reliable results, it is advantageous to implement the evaluation of the phase difference over a number of excitations measured in close temporal succession.

The above object also is achieved in accordance with the present invention by a magnetic resonance tomography apparatus operable in accordance with the above-described method.

DESCRIPTION OF THE DRAWINGS

FIG. 4 schematically shows the determination of the position of a slice in the course of the measurement.

DESCRIPTION OF THE PREFERRED EMBODIMENTS

Figure 1:
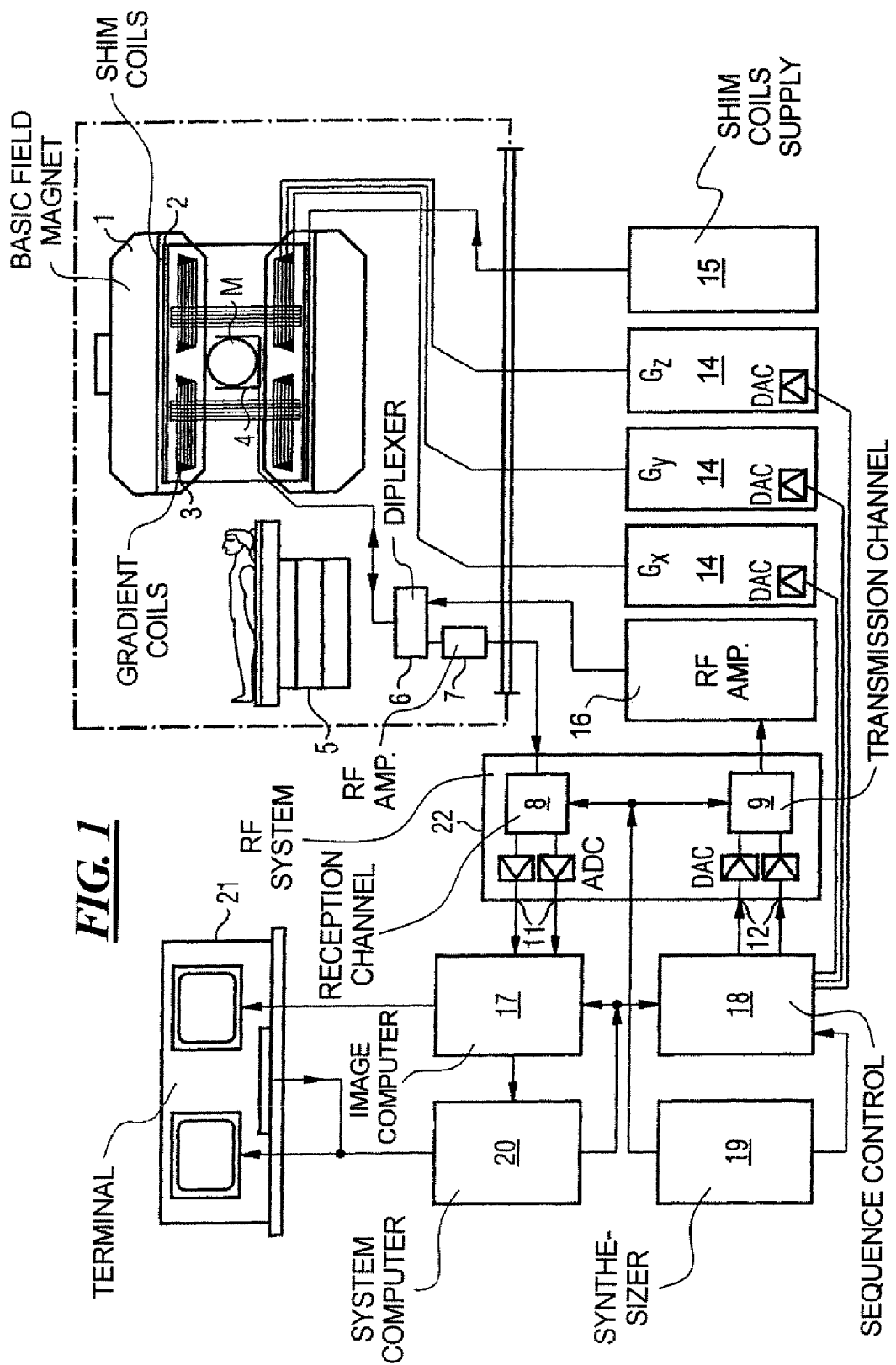
FIG. 1 is a schematic block diagram of a magnetic resonance tomography apparatus constructed and operating in accordance with the invention.

FIG. 1 is a schematic representation of a magnetic resonance tomography apparatus operable pulses according to the present invention. The design of the nuclear magnetic resonance tomography apparatus corresponds to the design of a conventional tomography apparatus, with the differences described below. A basic field magnet 1 generates a temporally constant strong magnetic field B0 to polarize or align the nuclear spins in the examination region of a subject such as, for example, a part of a human body to be examined. The high homogeneity of the basic field magnet required for the magnetic resonance measurement is defined in a spherical measurement volume M into which the parts of the human body to be examined are inserted. To support the homogeneity requirements, and in particular to eliminate temporally invariable influences, shim plates made of ferromagnetic material are mounted at appropriate locations. Temporally variable influences are eliminated by shim coils 2 that are controlled by a shim power supply 15.

In the basic field magnet 1, a cylindrical gradient coil system 3 is used that is composed of three windings. Each winding is supplied by an amplifier 14 with current to generate a linear gradient field in the one direction of the Cartesian coordinate system. The first sub-winding of the gradient field system 3 generates a gradient $G_x$ in the x-direction, the second winding of the gradient field system 3 generates a gradient $G_y$ in the y-direction, and the third winding of the gradient field system 3 generates a gradient $G_z$ in the z-direction. Each amplifier 14 contains a digital-analog converter that is controlled by a sequence control 18 for properly timed generation of the gradient pulses.

Within the gradient field system 3 is a radio-frequency antenna 4 that converts the radio-frequency pulse emitted by a radio-frequency power amplifier 30 into an electromagnetic alternating field to excite the nuclei and align the nuclear spins of the subject to be examined, or of the region of the subject to be examined. The alternating field originating from the precessing nuclear spins, meaning as a rule the nuclear spin echo signals ensuing from a pulse sequence composed of one or more radio-frequency pulses and one or more gradient pulses, is also converted by the radio-frequency antenna 4 into a voltage that is supplied via an amplifier 7 to a radio-frequency reception channel 8 of a radio-frequency system 22. The radio-frequency system 22 furthermore has a transmission channel 9 in which the radio-frequency pulses are generated for the excitation of the magnetic resonance. The respective radio-frequency pulses are digitally represented in the sequence control 18 as a sequence of complex numbers based on a pulse sequence predetermined by the system computer 20. This number sequence is respectively supplied inputs 12 as a real part and an imaginary part to a digital-analog converter in the radiation detector system 22, and supplied from this to a transmission channel 9. In the transmission channel 9, the pulse sequences are modulated by a radio-frequency carrier signal the base frequency of which corresponds to the resonant frequency of the nuclear spins in the measurement volume.

Switching between the transmission modes to reception mode ensues via a transmission-reception diplexer 6. The radio-frequency antenna 4 radiates the radio-frequency pulses to excite the nuclear spins in the measurement volume M and samples resulting echo signals. The acquired magnetic resonance signals are phase-sensitively demodulated in the reception channel 8 of the radio-frequency system 22 and are converted via respective digital-analog converters into a real part and an imaginary part of the measurement signal. An image is reconstructed by an image computer 17 from the measurement data acquired in such a manner. The administration of the measurement data, the image data and the control program ensues via the system computer 20. Based on a specification with control programs, the sequence control 18 monitors the generation of the respective desired pulse sequences and the corresponding scanning of k-space. In particular, the sequence control 18 controls the timed switching of the gradients, the emission of the radio-frequency pulses with defined phase and amplitude, and the reception of the magnetic resonance signals. The time base for the radio-frequency system 22 and the sequence control 18 is provided by a synthesizer 19. The selection of corresponding control programs to generate a magnetic resonance image, as well as the representation of the generated magnetic resonance image, ensues via a terminal 21 that has a keyboard as well as one or more screens.

For example, SSEPI measurements, which typically include phase correction measurements (or phase correcting scans, PC scans) integrated into the SSEPI sequence, can be effected with the apparatus specified above.

In conventional SSEPI measurements, such PC scans serve for the correction of duration differences of the gradients as are created due to analog switching techniques in an MRT apparatus, as well as to compensate eddy current effects. For example, such a gradient switching is technically realized by electronic oscillating circuits with an integrated power amplifier that compensates the ohmic losses. Given a sinusoidal or serpentine k-space sampling, however, an electronic delay in the sampling performance manifests itself as a loss of the phase coherency between even-numbered and odd-numbered spatial lines. This phase incoherency, which is created by the reversal of the readout trajectory in the sampling of every other k-space line, can be determined and corrected via measurement of the phase divergence of two or more (typically three) PC scans. In the case of echo planar imaging, such PC scans normally are undertaken with each acquisition or excitation of a slice.

Figure 2:
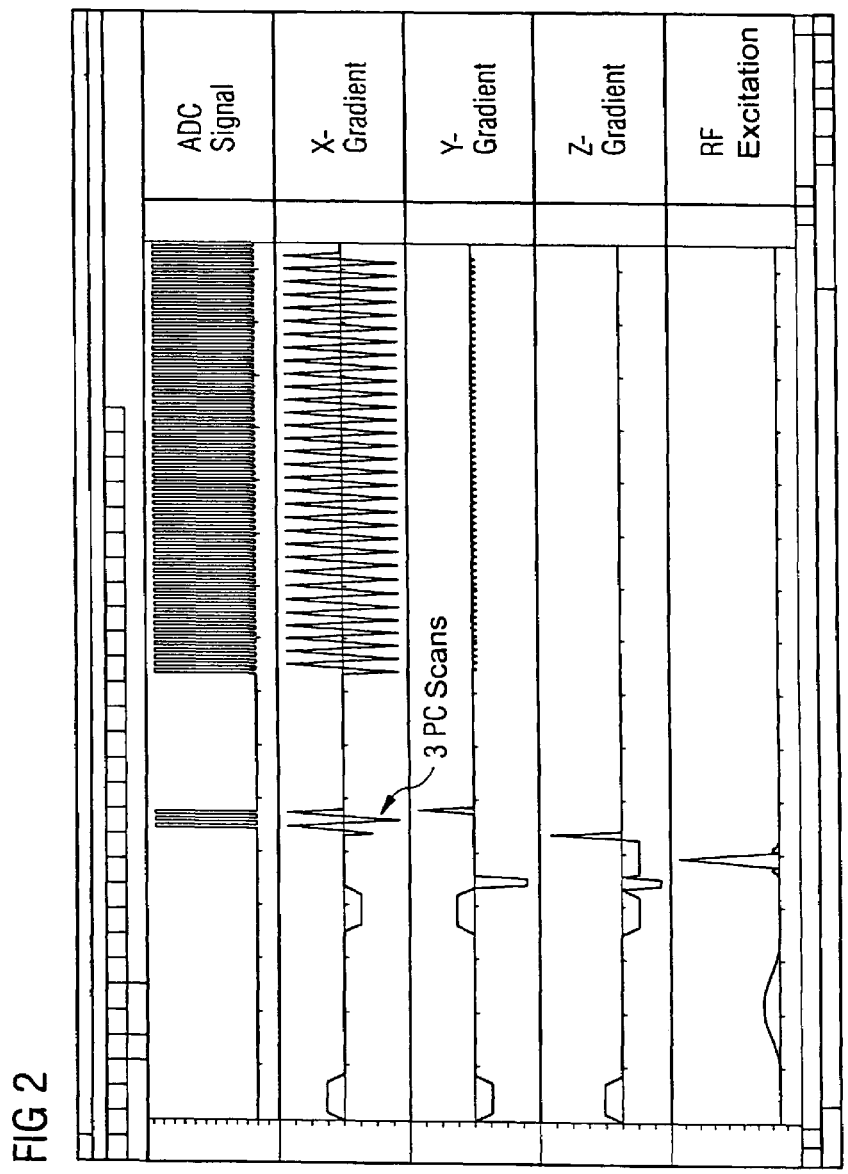
FIG. 2 schematically shows the sequence of an inventive EPI sequence.

The basis for the present invention is to subject such PC scans to a second analysis in order to acquire further information regarding the B0 field—for example, to create a one-dimensional B0 field map. In accordance with the invention three PC scans are used that, according to the EPI sequence in FIG. 2, scan the central k-space line three times immediately after the RF excitation pulse and before a phase coding. The first line shows the signals acquired by the ADC (ADC signals). The second line shows the sinusoidal behavior of the readout gradient (x-gradient) both in the three PC measurements and in the subsequently readout train. Line three shows the signal of the phase coding gradient (y-gradient) immediately after the third PC scan, line four shows the slice selection gradient (z-gradient) immediately after the RF excitation pulse in line five. Signals before the RF excitation pulse serve for the rephasing and dephasing as well as for fat saturation and are not considered in the following.

What are considered in the following are the first PC scan and the third PC scan. Both of these scans have been acquired in the same k-space direction and differ significantly because they have been acquired at different echo times (typically $\Delta TE \sim 1$-$2$ ms). The signals (echoes) of both of these PC scans are similarly comparable with regard to the effects mentioned above (such as eddy current and gradient duration differences) due to the sampling in the identical k-space direction.

The following explains how the phase difference between both of the echoes of the considered PC scans can be used to quantify the B0 field:

If A(k) and B(k) are the data points of the first and third phase correction scans (A(K) the point of the first PC echo, B(k) the data point of the third PC echo), after the Fourier transformation the values exist in space (A(x), B(x)) with absolute value ($A_M(x)$, $B_M(x)$) and phase ($\phi_A(x)$, $\phi_B(X)$):

$$A(x) = A_M(x) \cdot e^{i \cdot \phi_A(x)}$$

$$B(x) = B_M(x) \cdot e^{i \cdot \phi_B(x)}$$

Figure 3A:
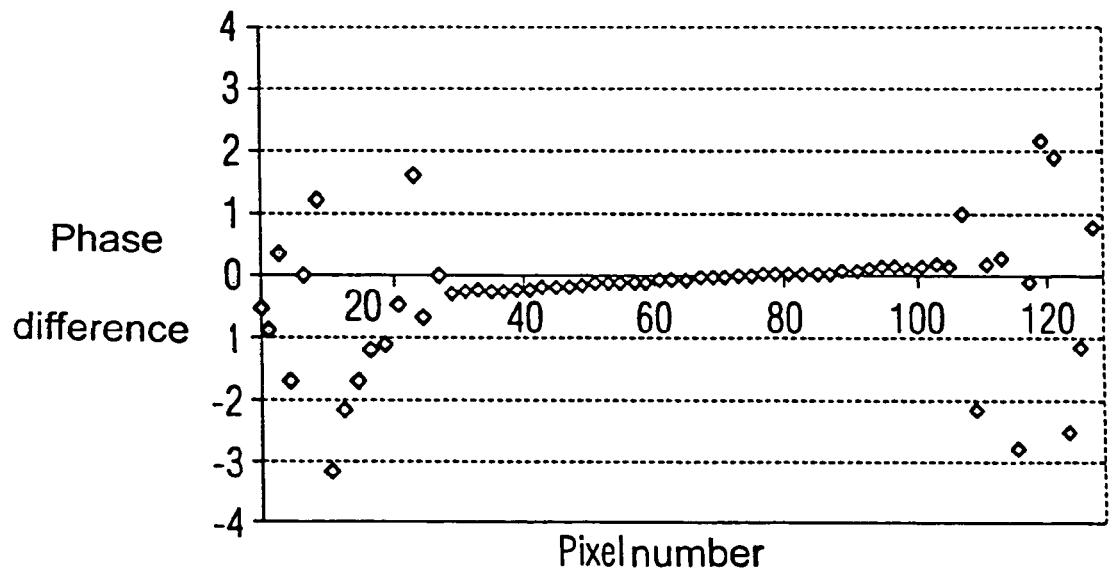
FIG. 3A shows the time curve of the determined phase of the B0 field along the k-space line during the measurement.
Figure 3B:
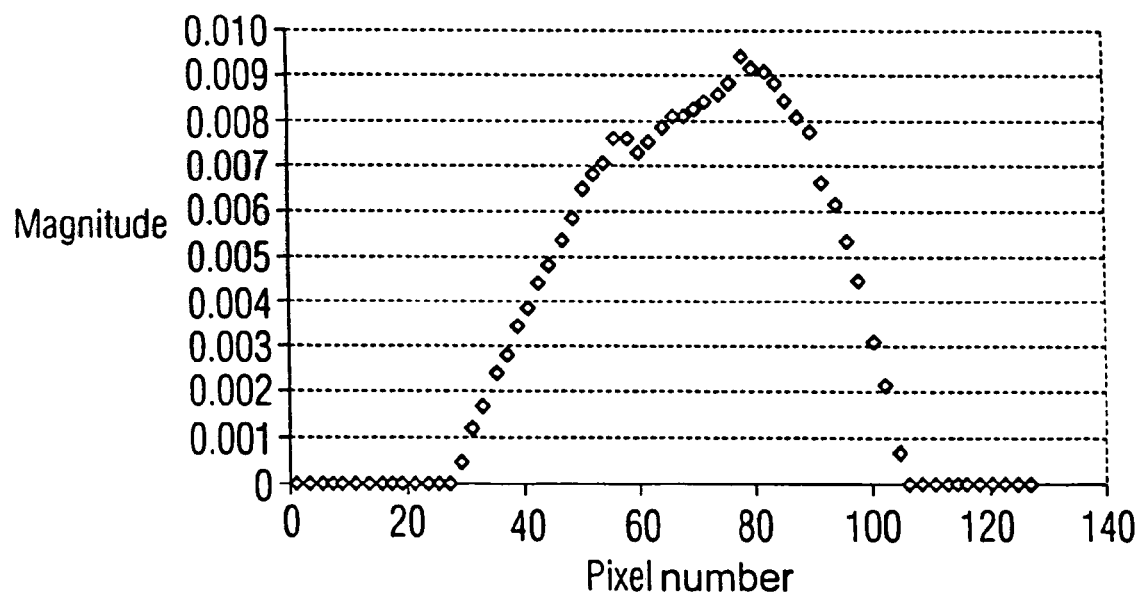
FIG. 3B shows the position of the subject via plotting of the signal magnitude dependent on the pixel number.
Figure 5A:
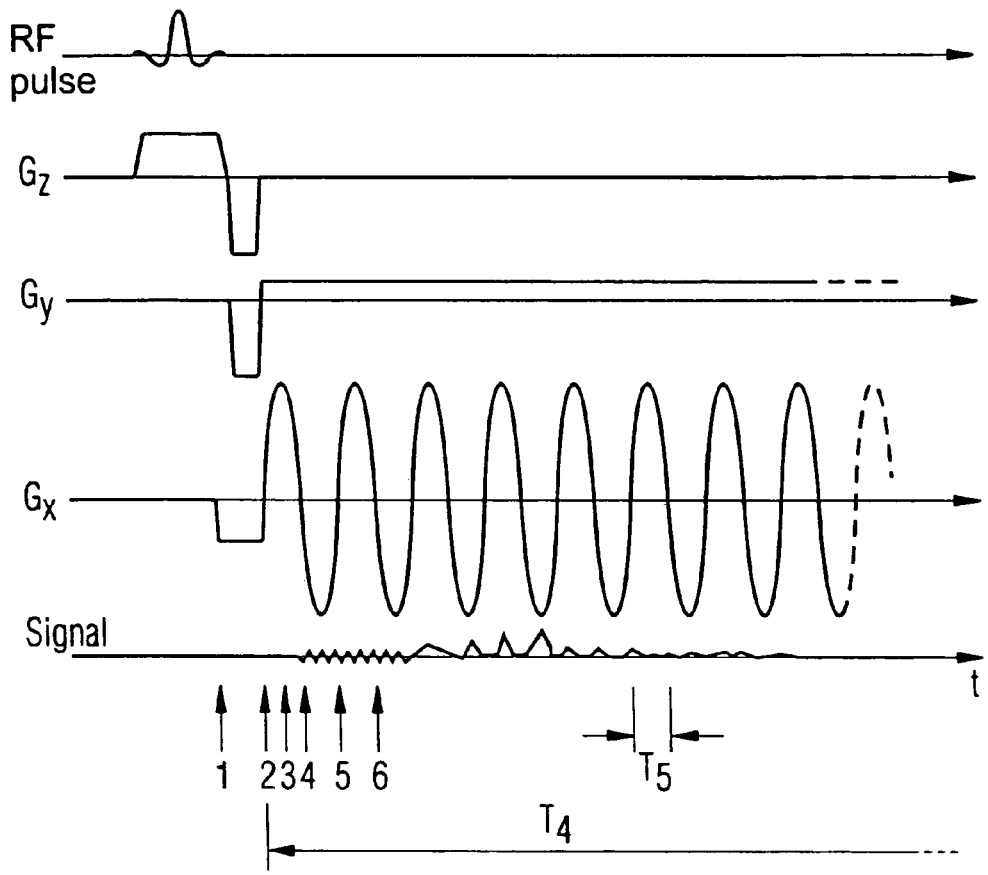
FIG. 5A schematically shows a conventional EPI sequence with sinusoidal readout gradients.
Figure 5B:
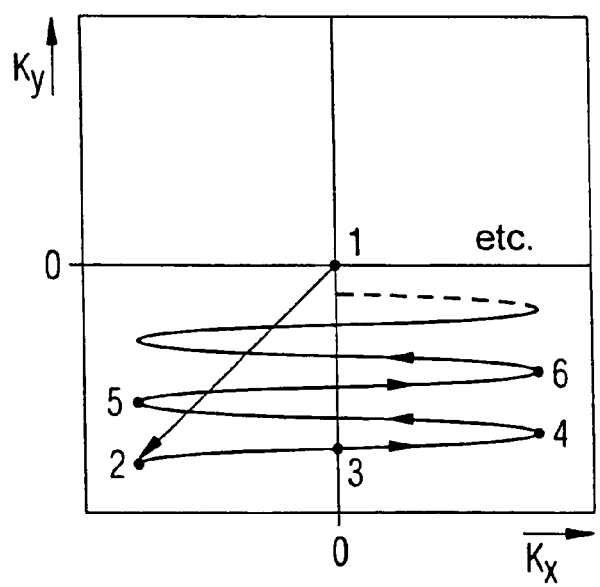
FIG. 5B shows the scan trajectory of a conventional EPI sequence according to FIG. 5A.

Both echoes are now multiplied (complexly conjugated) with one another (the evaluation could in principle also ensue before the Fourier transformation), and thus the result C(x) is calculated:

$$C_M(x) = \frac{A(x) \cdot B(x)^*}{|B(x)|} = \frac{A_M(x) \cdot e^{i \cdot \varphi_A(x)} \cdot B_M(x) \cdot e^{-i \cdot \varphi_B(x)}}{B_M(x)} = A_M(x) \cdot e^{i \cdot \Delta \varphi(x)}$$

wherein $\Delta\phi(x)$ is the phase difference at each point x. The echoes of the first and third PC scans differ significantly due to the further development of the phase during the aforementioned echo time difference. An additionally occurring relaxation influences only the signal magnitude and therefore can be disregarded here. An exemplary curve of the phase (for example given a spherical or cylindrical phantom) is shown in FIG. 3A; the curve of the magnitude is shown in FIG. 3B. The curve of the magnitude is used as an index for the validity of the phase information. The phase information is thus considered only in the range in which a correspondingly significant magnitude also exists. Outside of the significant range, the phase is arbitrary and is not evaluated.

In the further version of the method, an average value ($\bar{\phi}$) (weighted with the square of the magnitude ($C_M(x)^2$)) of the phase difference ($\Delta\phi(x)$) is calculated:

$$\bar{\varphi} = \frac{\sum_x \Delta\varphi(x) \cdot C_M(x)^2}{\sum_x C_M(x)^2}$$

A more linear fit can also be implemented; other weightings are also conceivable, whereby $C_M(x)$ is, for example, non-quadratic; however, the goal always remains the determination of the average phase.

From the echo time difference $\Delta TE$ of the PC scans used, the frequency offset $\Delta v$ of the actual resonance frequency can now be determined relative to the adjusted resonance frequency $V_{adjusted}$:

$$\Delta v = \frac{\bar{\varphi}}{2\pi \cdot \Delta TE}$$

Finally, the actual resonance frequency can be determined from the frequency offset and the adjusted resonance frequency $V_{adjusted}$. Thus the absolute value of the local B0 field can also be determined per slice via the gyromagnetic ratio $\gamma$:

$$B0 = \gamma \cdot \frac{1}{v_{adjusted} + \Delta v}$$

The method enables effects of a B0 offset as well as temporal B0 field fluctuations to be simultaneously corrected. For example, a B0 offset can be converted into a translation phase that can be used to correct the measured data.

Among the advantages of the inventive method with respect to the prior art are:

No additional measurements (scans) are necessary.

It is a single-shot method, meaning all necessary information is acquired after a single RF excitation. Thus no comparison of information or, respectively, calculation of information (see Durand et al.) occurs over a number of excitations. A B0 correction is thus also possible in applications in which a phase coherency between the individual excitations does not occur (for example perfusion measurement and diffusion measurement).

A sufficiently large ratio of signal to noise is achieved, since the phase correction scans are acquired with a short echo time directly after the excitation.

The calculation effort of the inventive method is very small, wherefore the correction can be integrated into the measurement method in real time without further steps.

In contrast to prevalent movement correction methods, in which apparent (induced via B0 fluctuations) and real subject movement are mixed and thus can no longer be separated, in the inventive method exclusively the B0 field effects are detected (for specific evaluations the real movement information or, respectively, the content of the real subject movement is necessary).

The inventive method was implemented as a prototype. The functionality was confirmed using two tests.

In a first test, a measurement phantom exhibiting a defined structure was used, which measurement phantom having been measured across a plurality of slices. Before the measurement, a three-dimensional shim procedure was executed. In total, three measurements were implemented:

1. an EPI measurement uncorrected,
2. an EPI measurement with correction cited above, as well as
3. a gradient echo measurement (GRE).

Since a GRE sequence is more intensive or, respectively, susceptible (generally by at least one to two orders of magnitude) to B0 field interferences than an EPI sequence, the GRE measurement can here be viewed as a reference. From the result data, it is clearly visible that the position of the structure of the measurement phantom in the corrected EPI measurement completely coincides with that of the GRE measurement. However, the structure position in the uncorrected EPI measurement deviates significantly. The correct function of the absolute quantification of the B0 field is thus confirmed.

In a second test, the inventive method was tested with regard to its precision, in particular in a time series analysis as it is, for example, implemented in the framework of an fMRT application. For this, a time series of 100 EPI data sets of a measurement phantom was acquired. FIG. 4 shows the position of a slice in the course of a measurement in voxel units. An offset of approximately 0.4 voxels (1.2 mm) is visible as a start value, meaning the image of the measured slice is displaced by 1.2 mm in the direction of the phase coding gradient due to a frequency offset caused by B0 deviation. Due to a drift of the B0 field, the image position—as is clear using the diagram—changes by a total of 0.25 voxels (0.75 mm) in the course of the measurement. This means that the hundredth image of the slice is displaced by a quarter-voxel relative to the first image of the slice, and therefore both or all images of this time series can be compared absolutely. If it is assumed that the B0 field does not change significantly from measurement to measurement, the error of this method in this example can be roughly estimated using the relative distribution of the adjacent slice positions with approximately ±0.03 voxels (±0.09 mm). Overall, the method is thus precise enough in order to correct apparent movements due to B0 fluctuations—specifically in an fMRT application. If one converts the errors of the slice position determination into an error of the frequency determination (the bandwidth of an EPI sequence in the phase coding direction for the example is 28.8 Hz/pixel), a frequency displacement of $\Delta v = \pm 1$ Hz results.

A further advantage of the inventive method is a simultaneous correction, implicitly given by the method, of further magnetic field inhomogeneities, caused by the applied gradient, that overlie the base field in addition to the statistical field inhomogeneities in the form of terms known as "Maxwell terms". If one considers the basic magnetic field $B_0$, which is overlaid by a strong linear gradient in the x-direction $G_x$, a resulting magnetic field $\vec{B}$ is obtained in the form $$\vec{B} = (0, 0, B_0 + G_x x)$$

If one considers the fact that a magnetic field $\vec{B}$ generated by gradient coils (Maxwell or Helmholtz coils) has to satisfy the Maxwell equations for vacuum $$\text{div } \vec{B} = 0 \text{ as well as rot } \vec{B} = \vec{0},$$

it can be shown that the resulting magnetic field is overlaid by a component in the x-direction:

$$\vec{B} = (G_x z, 0, B_0 + G_x x)$$

The magnitude $|\vec{B}|$ is:

$$|\vec{B}| = \sqrt{(B_0 + G_x x)^2 + (G_x z)^2}$$

In the generally valid case that $B_0 \gg (G_x x), (G_x z)$, $|\vec{B}|$ can be developed in the form of a Taylor series up to the first order:

$$|\vec{B}| = B_0 + G_x x + (G_x z)^2 / (2 B_0)$$

As is to be seen from this, the magnitude is composed of not only the homogenous components of the basic field B0 and the linear components of the gradient in the x-direction $G_x x$, but also of a "Maxwell term" $(G_x z)^2/(2 B_0)$ that is proportional to the square of z and to the square of the gradient amplitude, as well as indirectly proportional to $B_0$. This term effectively leads to a new resonant frequency with a frequency shift $\omega_{eff}$ (frequency offset) of $$\omega_{eff}(G_x) = \gamma G_x^2 z^2 / 2 B_0$$

The same result for a gradient in the y-direction states that $$\omega_{eff}(G_y) = \gamma G_y^2 z^2 / 2 B_0$$

and for a gradient in the z-direction $$\omega_{eff}(G_z) = \gamma G_z^2 \vec{r}^2 / 8 B_0,$$

wherein $\vec{r}$ designates the distance from the z-axis with $r^2 = x^2 + y^2$. In summary, it is true for all three gradients that the Maxwell term

- is proportional to the square of the gradient amplitude and therefore independent of their signs,
- is increasingly more influential the smaller the base field $B_0$, and
- varies with the square of the respective dimension.

In contrast to conventional slow acquisition techniques such as, for example, GRE, in fast imaging methods (such as, for example, single-shot EPI measurements as they are discussed here) the Maxwell term cannot be neglected. Fast imaging methods on the one hand exhibit a very high readout gradient; on the other hand the readout time is very long. Both lead to the statistical frequency shifts discussed above (due to insufficient shimming) in the course of the measurement through the readout train at a considerable frequency displacement of the resonance frequency, and thus a visible image distortion or displacement in the respective dimension occurs. By measurement of two phase correction scans, the respective average Maxwell phases are acquired as part of the average frequency offset, and the average frequency shift based on the Maxwell term is compensated by the comparison of both PC scans.

The following exemplary embodiments or applications of the inventive method are possible:

A) During an MRT imaging method (for example, EPI), B0 field offsets are permanently corrected via the inventive evaluation during the measurement. The image position thus remains stable in the phase coding correction during the measurement, and thus also corresponds to the calculated image position.

B) Anatomical high-resolution data (for example, images of a spin echo sequence) are overlaid on the images (fMRT maps, perfusion maps, diffusion maps etc.) acquired via the inventive imaging method (for example, EPI). Via the inventive method, the image positions of the inventive method coincide with the anatomical high-resolution measurement. Error associations are thus reduced or eliminated.

C) The use of the inventive method is reasonable in connection with a movement correction (for example in fMRT imaging, perfusion imaging, diffusion imaging). Thus, for example, the local shim changes given a head position change. In this case, different displacements occur per slice. Via the use of a correction with the inventive method, these apparent movements are corrected based on the shim change, such that the result of the movement correction is not impaired by different image positions per slice.

D) Instead of calculating the B0 field map exclusively from PC scans, this can also be determined from a PC scan and the average phase of the middle k-space line. It should be noted that both are acquired in the same direction. The advantage is the larger time difference of both acquisitions, during which a larger phase can be established, and the method thus modified is therefore more sensible.

E) Given segmented measurements in which the k-matrix is scanned in blocks or in segments (typically with TSE, EPI or SSEPI), image artifacts based on different B0 magnetic fields can be prevented in the acquisition of the different blocks or segments.

F) Given spectroscopic measurements in which a spectrum is typically measured across a plurality of minutes, with the specified method (thus interleaving or, respectively, incorporation of PC scans in the spectroscopic measurement) current B0 field determinations can be implemented. Interferences by B0 field fluctuations that, for example, would cause a peak broadening hereby fall away. Given an interleaving (PC scans between the 90° and 180° pulses) and therewith a simultaneous use of the excitation pulse, advantageously as well no measurement time extension occurs.

G) In the event that an interleave of the PC scans or, respectively, the implementation of the PC scan measurement in the actual measurement sequence is unwanted (for example for time reasons), the PC scans can also be acquired via additional excitation pulses between the actual measurement sequences, and thus the current B0 field value can be obtained. In order to prevent a saturation of the magnetic resonance, preferably no flip angle should then be used for the respective PC scan measurement. In this case, the excitation volume of the PC scan measurement does not have to be identical with the excitation volume of the slice to be measured (for example, an excitation of the entire measurement volume would be conceivable).

H) After calculation of the phase difference of the PC scan, for example, a linear compensation line or a function of higher order is calculated, whereby the magnitude represents an index for the validity of the phase information. With the aid of this information, the shim of the basic field in the readout gradient can be corrected for the currently acquired slice. A correction of the measurement data can also ensue using this information. Statistical and dynamic effects that lead to an imperfect curve of the B0 field can hereby be corrected for each slice.

I) To increase the precision of the method, in the measurement, for example, of a number of slices/excitations distributed across a volume and acquired in close temporal succession, the evaluation of the phase difference can ensue conjointly in order to thus achieve reliable results, for example, for the weighted average value or the function explained under H).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for calculating a one-dimensional map of a basic magnetic field (B0) for correcting image artifacts in a magnetic resonance tomographic image due to changes in the basic magnetic field, comprising the steps of:

obtaining magnetic resonance signals representing magnetic resonance data from a slice of an examination subject by executing a fast magnetic resonance tomography imaging sequence applied to said slice in a B0 field under conditions that disrupt phase-coherence over multiple executions of said sequence, said imaging sequence comprising at least three phase correction scans, and acquiring measurement signals representing data points for each of said phase correction scans;

calculating a phase difference between corresponding data points respectively in two of said phase correction scans for said slice, for which said measurement signals were acquired in a same readout direction for all data points in said two of said phase correction scans on a point-by-point basis;

identifying an average phase difference for said two of said phase correction scans by adapting a mathematical function;

determining an adjusted resonant frequency from said average phase difference and from echo time differences between said two of said phase correction scans, and calculating a frequency offset between an actual resonant frequency and said adjusted resonant frequency;

calculating a B0 field map of said B0 field dependent on said frequency offset;

dependent on said mathematical function, correcting shimming of said B0 field in said readout direction; and after correcting said shimming of said B0 field, correcting said magnetic resonance data for said slice using said B0 field map.

2. A method as claimed in claim 1 comprising determining said average phase difference using average value formation.

3. A method as claimed in claim 1 comprising calculating said B0 field map by calculating an absolute value of said B0 field versus the gyromagnetic ratio.

4. A method as claimed in claim 1 comprising calculating said B0 field map by calculating a change of said B0 field relative to said B0 field at a beginning of said sequence.

5. A method as claimed in claim 1 comprising executing said fast magnetic resonance tomography sequence multiple times, and obtaining said measurement signals for said plurality of phase correction scans in one execution of said sequence and obtaining said magnetic resonance data of said slice in another execution of said sequence.

6. A method as claimed in claim 5 comprising, in said execution of said sequence for obtaining said measurement signals for said plurality of phase correction scans, employing an RF excitation pulse having a small flip angle.

7. A method as claimed in claim 1 comprising generating an image of said slice from said measurement data corrected with said B0 field map, and overlaying said image with an anatomical high-resolution image.

8. A method as claimed in claim 7 comprising determining, from said image overlaid with said anatomical high-resolution image, determining if an apparent translation in said image differs from a real translation and, if so, correcting said apparent translation.

9. A method as claimed in claim 1 wherein said sequence is a magnetic resonance spectroscopic sequence, and wherein said magnetic resonance data are spectroscopic data obtained in spectroscopic measurements in said sequence, and comprising arbitrarily interleaving said phase correction scans with said spectroscopic measurements.

10. A method as claimed in claim 1 wherein said sequence comprises a plurality of excitations of said slice in close temporal succession, and wherein the step of determining said phase difference comprises determining said phase difference for said plurality of excitations.

11. A method as claimed in claim 1 comprising administering a contrast agent to the examination subject and executing said fast magnetic resonance tomography imaging sequence while said contrast agent is effective in said slice.

12. A method as claimed in claim 1 comprising executing a functional magnetic resonance imaging sequence as said fast magnetic resonance tomography imaging sequence.

13. A method as claimed in claim 1 comprising executing a diffusion imaging sequence as said fast magnetic resonance tomography imaging sequence.

14. A method as claimed in claim 1 comprising obtaining said magnetic resonance signals and said measurement signals both in one execution of said fast magnetic resonance tomography imaging sequence.

15. A magnetic resonance tomography apparatus, comprising:
a magnetic resonance data acquisition unit configured to receive an examination subject therein;
a controller that operates said magnetic resonance data acquisition unit to obtain magnetic resonance signals representing magnetic resonance data from a slice of the examination subject by causing said magnetic resonance data acquisition unit to execute a fast magnetic resonance tomography imaging sequence, applied to said slice in a B0 field under conditions that disrupt phase-coherence over multiple executions of said sequence, said imaging sequence comprising at least three-phase correction scans, and to acquire measurement signals representing data points for each of said phase correction scans; and
a computer that calculates a phase difference between corresponding data points respectively in two of said phase correction scans for said slice, for which said measurement signals were acquired in a same readout direction for all data points in said two of said phase correction scans on a point-by-point basis, identifies an average phase difference for said two of said phase correction scans by adapting a mathematical function, determines an adjusted resonant frequency from said average phase difference and from echo time differences between said two of said phase correction scans, and calculating a frequency offset between an actual resonant frequency and said adjusted resonant frequency, calculates a B0 field map of said B0 field dependent on said frequency offset, dependent on said mathematical function, corrects shimming of said B0 field in said readout direction and, after correcting said shimming of said B0 field, corrects said magnetic resonance data for said slice using said B0 field map.

16. A magnetic resonance tomography apparatus as claimed in claim 15 comprising a contrast agent injector that injects a contrast agent into the examination subject prior to executing said fast magnetic resonance tomography imaging sequence, and wherein said controller operates said magnetic resonance data acquisition unit to execute said fast magnetic resonance tomography imaging sequence while said contrast agent is effective in said slice.

17. A magnetic resonance tomography apparatus as claimed in claim 15 wherein said controller operates said magnetic resonance data acquisition unit to execute a functional magnetic resonance imaging sequence as said fast magnetic resonance tomography imaging sequence.

18. A magnetic resonance tomography apparatus as claimed in claim 15 wherein said controller operates said magnetic resonance data acquisition unit to execute a diffusion imaging sequence as said fast magnetic resonance tomography imaging sequence.

19. A system as claimed in claim 15 wherein said controller operates said magnetic resonance data acquisition unit to obtain said magnetic resonance signals and said measurement signals both in one execution of said fast magnetic resonance tomography imaging sequence.

* * * * *